United States Patent
Tan et al.

(10) Patent No.: US 7,463,086 B2
(45) Date of Patent: Dec. 9, 2008

(54) APPARATUS AND METHOD FOR TUNING A BAND PASS FILTER

(75) Inventors: Seeteck Tan, Singapore (SG); Meng Chu, Zhangjiang Hi-tech Park (CN); Xiaozhe Chen, Zhangjiang Hi-tech Park (CN)

(73) Assignee: O2Micro International Ltd., Georgetown (KY)

( * ) Notice: Subject to any disclaimer, the term of this patent is extended or adjusted under 35 U.S.C. 154(b) by 1 day.

(21) Appl. No.: 11/601,079

(22) Filed: Nov. 17, 2006

(65) Prior Publication Data

US 2008/0139160 A1   Jun. 12, 2008

(51) Int. Cl.
*H03K 5/00* (2006.01)
(52) U.S. Cl. .................................. 327/557; 327/553
(58) Field of Classification Search .......... 327/551–559
See application file for complete search history.

(56) References Cited

U.S. PATENT DOCUMENTS

| | | | |
|---|---|---|---|
| 5,281,931 A | 1/1994 | Bailey | |
| 5,440,264 A | 8/1995 | Sevenhans | |
| 5,625,317 A * | 4/1997 | Deveirman | 327/553 |
| 5,650,950 A | 7/1997 | Siniscalchi | |
| 6,646,498 B2 * | 11/2003 | Mohieldin et al. | 327/553 |
| 6,985,710 B1 * | 1/2006 | Margairaz et al. | 455/302 |
| 7,002,404 B2 * | 2/2006 | Gaggl et al. | 327/553 |
| 7,135,915 B2 * | 11/2006 | Bailey et al. | 327/553 |
| 7,164,311 B2 * | 1/2007 | Chowdhury et al. | 327/553 |
| 7,248,103 B2 * | 7/2007 | Marais | 327/553 |
| 2002/0135417 A1 | 9/2002 | Lee | |
| 2005/0156661 A1 | 7/2005 | Kimura | |

OTHER PUBLICATIONS

Michiel Steyaert and Jose Silve-Martinez, A 10.7 MHz CMOS OTAR-R-C Bandpass Filter with 68dB Dynamic Range and On-Chip Automatic Tuning, 8172 IEEE International Solid-State Circuits Conference 35 (1992) February, New York, US.

* cited by examiner

*Primary Examiner*—Dinh T. Le
(74) *Attorney, Agent, or Firm*—Wang Law Firm; Li Kan Wang

(57) ABSTRACT

A tunable band pass filter is provided. The tunable band pass filter includes a band pass filter and a plurality of switches coupled to the band pass filter. The band pass filter includes a plurality of transconductors and a plurality of capacitors. The tunable band pass filter can be configured as a complex band pass filter or as a tuning device for tuning the center frequency of the complex band pass filter depending on the operation of the plurality of switches. The tuning device includes at least one tuning integrator and a comparator. The tuning integrator includes at least one transconductor and a capacitor. The transconductor is selected via the plurality of switches from the plurality of transconductors and the capacitor is selected via the plurality of switches from said plurality of capacitors. The selected transconductor and the selected capacitor deterrminines the center frequency of the band pass filter.

31 Claims, 17 Drawing Sheets

APPARATUS AND METHOD FOR TUNING A BAND PASS FILTER

FIELD OF THE INVENTION

The invention relates to methods for tuning filters and, more particular, to tuning band pass filters in a wireless receiver.

BACKGROUND OF THE INVENTION

A wireless receiver generally includes a mixer for converting the frequency of a wireless signal to within a certain frequency range and a filter for further selecting a desired frequency by filtering out unwanted frequencies.

The filter may include, but not limited to, a low pass filter (LPF), a high pass filter, a band pass filter (BPF), and a complex band pass filter. For example, FIG. 1 shows a Butterworth low pass filter (LPF) that employs passive inductors and capacitors. The bandwidth of the LPF is designed for 1 MHz. With a standard synthesis method, the resistance, capacitance and inductance in FIG. 1 can be calculated as following:

$Rs=1k\Omega, R_L=1k\Omega, C1_{LPF}=C2_{LPF}=227.6pF,$
$L2_{LPF}=253.1uH.$

Using transconductors and capacitors to realize a filter has gained a wide industrial acceptance. FIG. 2 illustrates a LPF implemented with transconductors and capacitors. In order to have the same bandwidth as that of the LPF in FIG. 1, the relationship between the capacitance, resistance, and inductance in FIG. 1 and transconductance and capacitance in FIG. 2 must follow the equations below:

$$G_{mS} = \frac{1}{R_S},$$

$$G_{mL} = \frac{1}{R_L},$$

$$G_{mG} = \frac{1}{1K\Omega} = 1mS,$$

$$C1 = C1_{LPF},$$

$$C3 = C3_{LPF},$$

$$C2 = G_{mG}^2 L2_{LPF}$$

It should be noted that a suitable value for the transconductor $G_{mG}$ is required. In this example, $G_{mG}$ is selected to be 1 milli-siemens. Thus, the calculated values for the components in FIG. 2 are:

$G_{mS}=1mS, G_{mL}=1mS, G_{mG}=1mS, C1=227.6pF,$
$C2=253.1pF,$ and $C3=227.6pF.$ FIG. 3 illustrates a complex BPF transformed from the LPF network of FIG. 2. The frequency responses of the LPF of FIG. 2 and the complex BPF of FIG. 3 are shown in FIG. 4. The LPF with a bandwidth of 1 MHz is transformed to a complex BPF with a center frequency of 4 MHz and a bandwidth of 2 MHz. The complex BPF receives two quadrature input signals, Vin and j*Vin, and outputs two quadrature signals, Vout and j*Vout. The complex BPF includes two LPFs 302, 304 and additional transconductors $G_{mC1}$, $G_{mC2}$, $G_{mC3}$, 306. The center frequency of the complex BPF $F_o$ is determined by the value of transconductors $G_{mC1}$, $G_{mC2}$, $G_{mC3}$ and capacitors in the two LPFs 302, 304, where $G_{mC1}=2\pi F_0 C_1$ $G_{mC2}=2\pi F_0 C_2$       (1)

$G_{mC3}=2\pi F_0 C_3$

Since the center frequency $F_o$ is 4 MHz in this example, thus, the calculated values for transconductors $G_{mC}$ are $G_{mC1}=5.72mS, G_{mC2}=6.36mS,$
$G_{mC3}=5.72mS.$ The major drawback of the above-mentioned three examples is that the pole frequencies of these filters are subject to absolute component variation. When implementing these filters in integrated circuits, variation in resistance, capacitance, transconductance can occur. For example, for a Transconductor-Capacitor (Gm-C) filter, the transconductance and capacitances can vary easily within a range of ±20%. Therefore, it is impossible to obtain a desired filter frequency response as designed. Either the transconductors or the capacitors need to be adjusted in order to get the desired frequency response. Such adjustment may be referred to as filter tuning or filter trimming.

FIG. 5 illustrates a traditional method for filter tuning employing a separate tuning device. Device 500 includes a main filter 502 and a tuning device 504. The tuning device 504 includes a voltage control oscillator (VCO) 506, a phase detector 508, and a loop filter 510. The voltage control oscillator (VCO) 506 utilizes transconductors and capacitors that are duplicates of the transconductors and capacitors in the main filter to generate a frequency Fvco. It should be noted that it is also possible to use a voltage controlled low pass filter (VCLPF) instead of a VCO 506 in the tuning device 504. The phase detector 508 receives Fvco and a reference frequency Fref, and detects the phase difference between Fvco and Fref. A detected difference is provided to the loop filter 510 where the loop filter 510 is capable of adjusting the value of the components (i.e. transconductors or capacitors) in the main filter 502 to nominal design values. Therefore, the frequency of the main filter can be kept at a stable and accurate value.

However, there are several disadvantages with this tuning approach. Firstly, the continuous tuning of VCO 506 will generate noise that affects the operation of the filter. Secondly, the VOC 506 consumes additional power and occupies additional physical area. Thirdly, the pole frequency of VCO 506 could be very different from that of the filter under certain circumstance which may result in poor tuning accuracy.

Thus, it is to an improved filter tuning method that is able to provide an accurate tuning without requiring additional power and area and without introducing additional noise sources that present invention is directed to.

SUMMARY OF THE INVENTION

There is provided a tunable band pass filter. The tunable band pass filter includes a band pass filter and a plurality of switches coupled to the band pass filter. The band pass filter includes a plurality of transconductors and a plurality of capacitors. The plurality of switches operates in a first state and a second state. When the plurality of switches is in the first state, the tunable band pass filter is configured as a complex band pass filter. When the plurality of switches is in the second state, the tunable band pass is configured as a tuning device for tuning the center frequency of the band pass filter to a predetermined value. The tuning device includes at least one tuning integrator and a comparator. The tuning integrator includes at least one transconductor and a capacitor. The transconductor is selected via the plurality of switches from the plurality of transconductors and the capacitor is selected via the plurality of switches from said plurality of capacitors. The selected transconductor and the selected capacitor determinines the center frequency of the band pass filter.

There is also provided a wireless receiver for receiving a wireless signal. The wireless receiver includes a mixer and a tunable filter coupled to the mixer. The mixer is capable of shifting the wireless signal to a lower frequency signal. The tunable filter is capable of adjusting the lower frequency signal to a predetermined center frequency signal. The tunable filter includes a band pass filter and a plurality of switches coupled to the band pass filter. The band pass filter includes a plurality of transconductors and a plurality of capacitors. The plurality of switches operates in a first state and a second state. When the plurality of switches is in the first state, the tunable band pass filter is configured as a complex band pass filter. When the plurality of switches is in the second state, the tunable band pass is configured as a tuning device for tuning the center frequency of the band pass filter to the predetermined center frequency. The tuning device includes at least one tuning integrator and a comparator. The tuning integrator includes at least one transconductor and a capacitor. The transconductor is selected via the plurality of switches from the plurality of transconductors and the capacitor is selected via the plurality of switches from said plurality of capacitors. The selected transconductor and the selected capacitor determinines the center frequency of the band pass filter.

There is also provided a method for providing a tunable band pass filter where the tunable band pass filter has a plurality of transconductors and a plurality of capacitors. The method includes providing a mode selection signal to the tunable band pass filter, configuring said tunable band pass filter to operate as a band pass filter when the mode selection signal represents a filtering mode, and configuring the tunable band pass filter to operate as a tuning device for tuning a center frequency of the tunable band pass filter when said mode selection signal represents a tuning mode.

BRIEF DESCRIPTION OF THE DRAWINGS

Features and advantages of embodiments of the invention will become apparent as the following Detailed Description proceeds, and upon reference to the Drawings, where like numerals depict like elements, and in which.

DETAILED DESCRIPTION OF THE INVENTION

Figure 1:
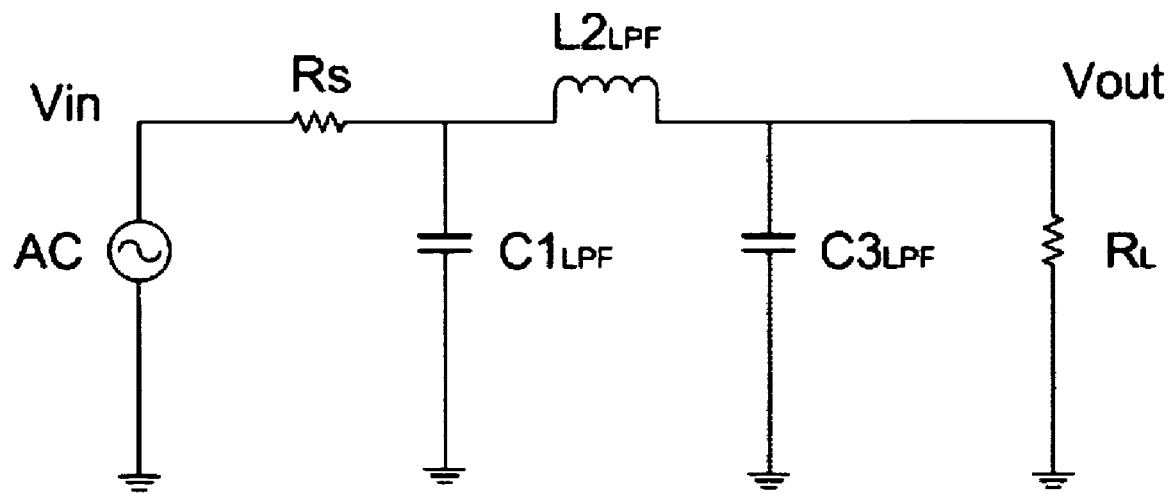
FIG. 1 illustrates a Butterworth low pass filter (LPF) that employs passive inductors and capacitors.
Figure 2:
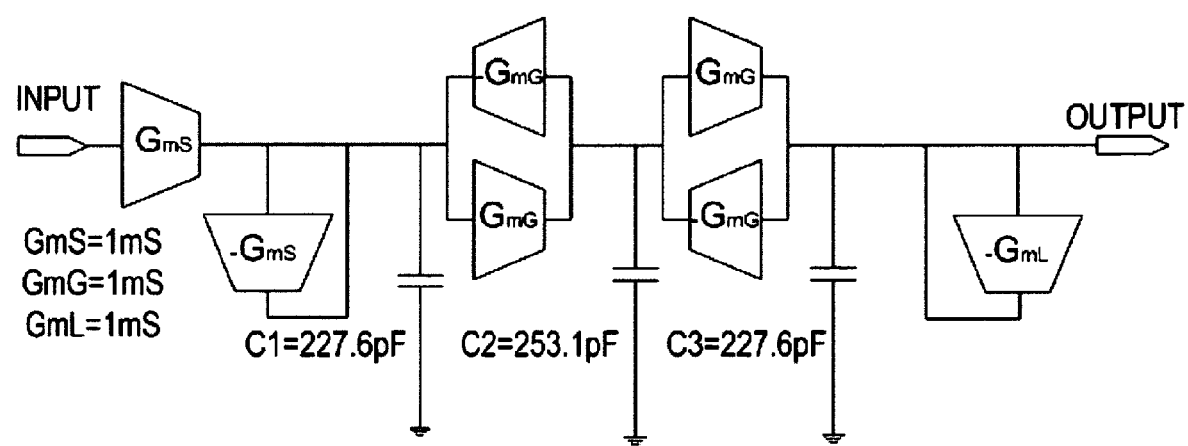
FIG. 2 illustrates a low pass filter that employs transconductors and capacitors.
Figure 3:
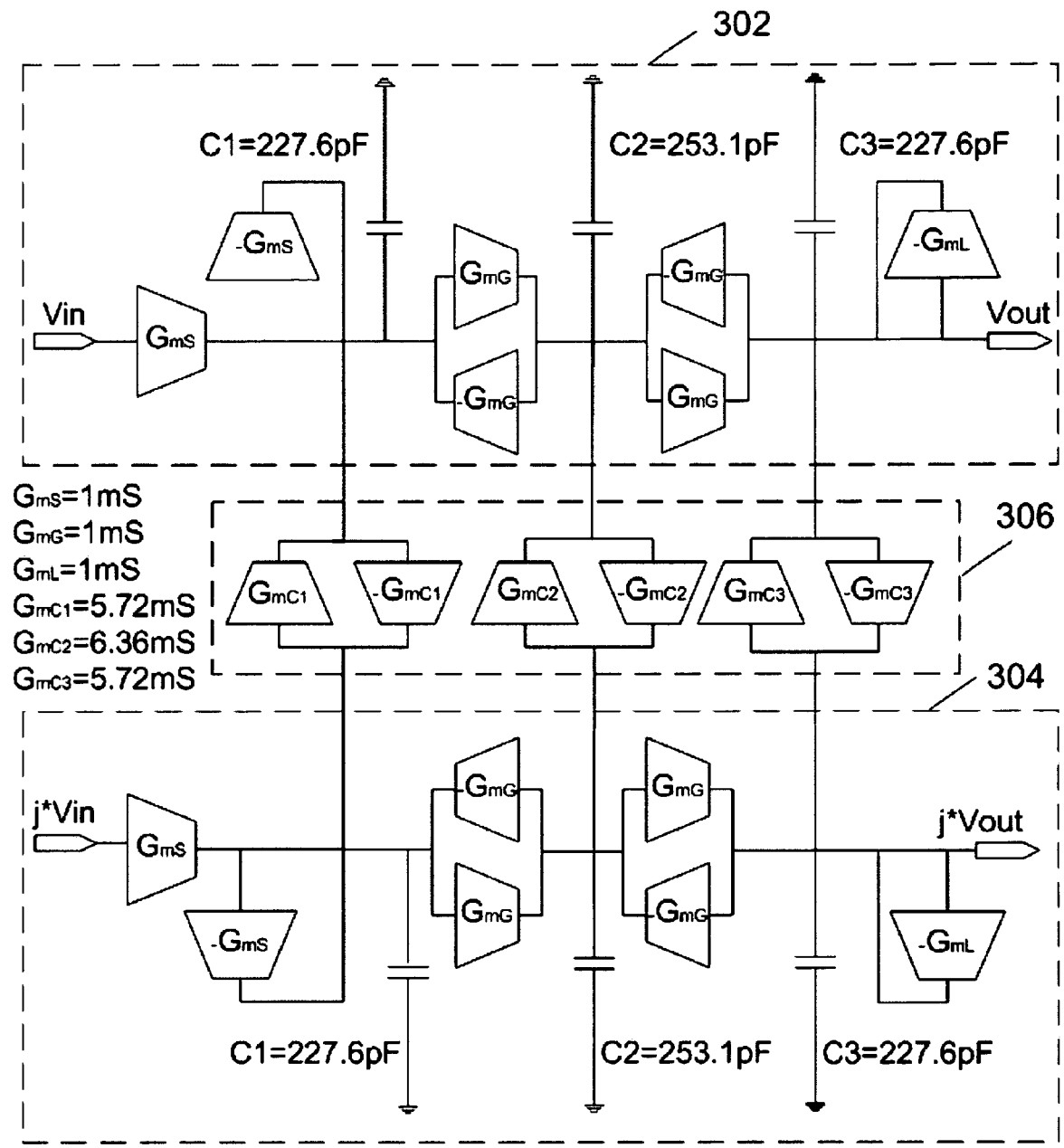
FIG. 3 illustrates a complex band pass filter network.
Figure 4:
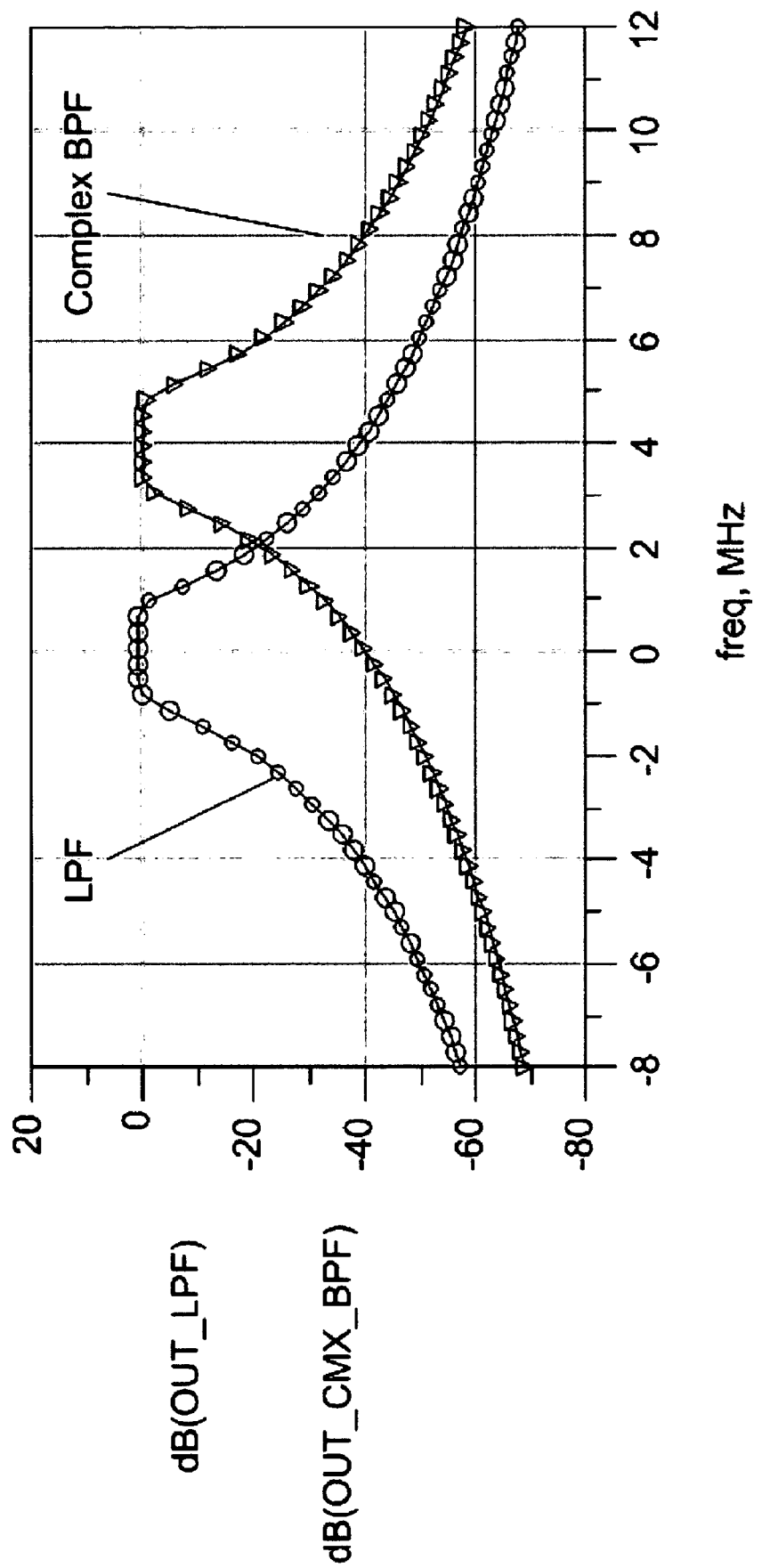
FIG. 4 illustrates frequency responses of a LPF and a complex BPF.
Figure 5:
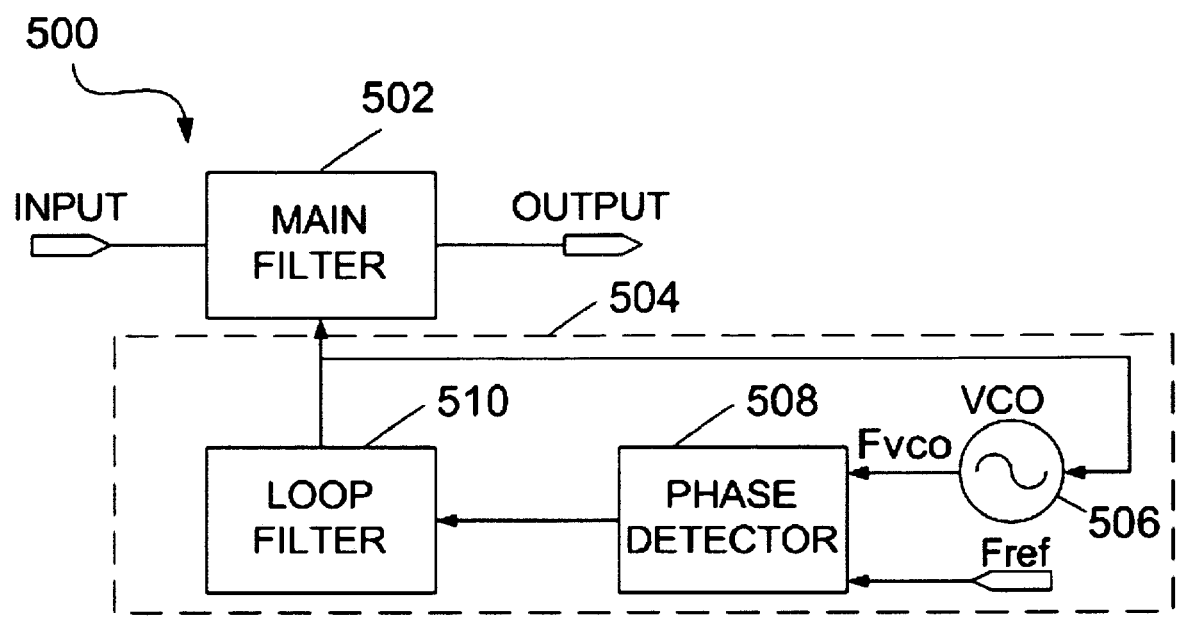
FIG. 5 illustrates a prior art of a traditional filter tuning method.
Figure 6:
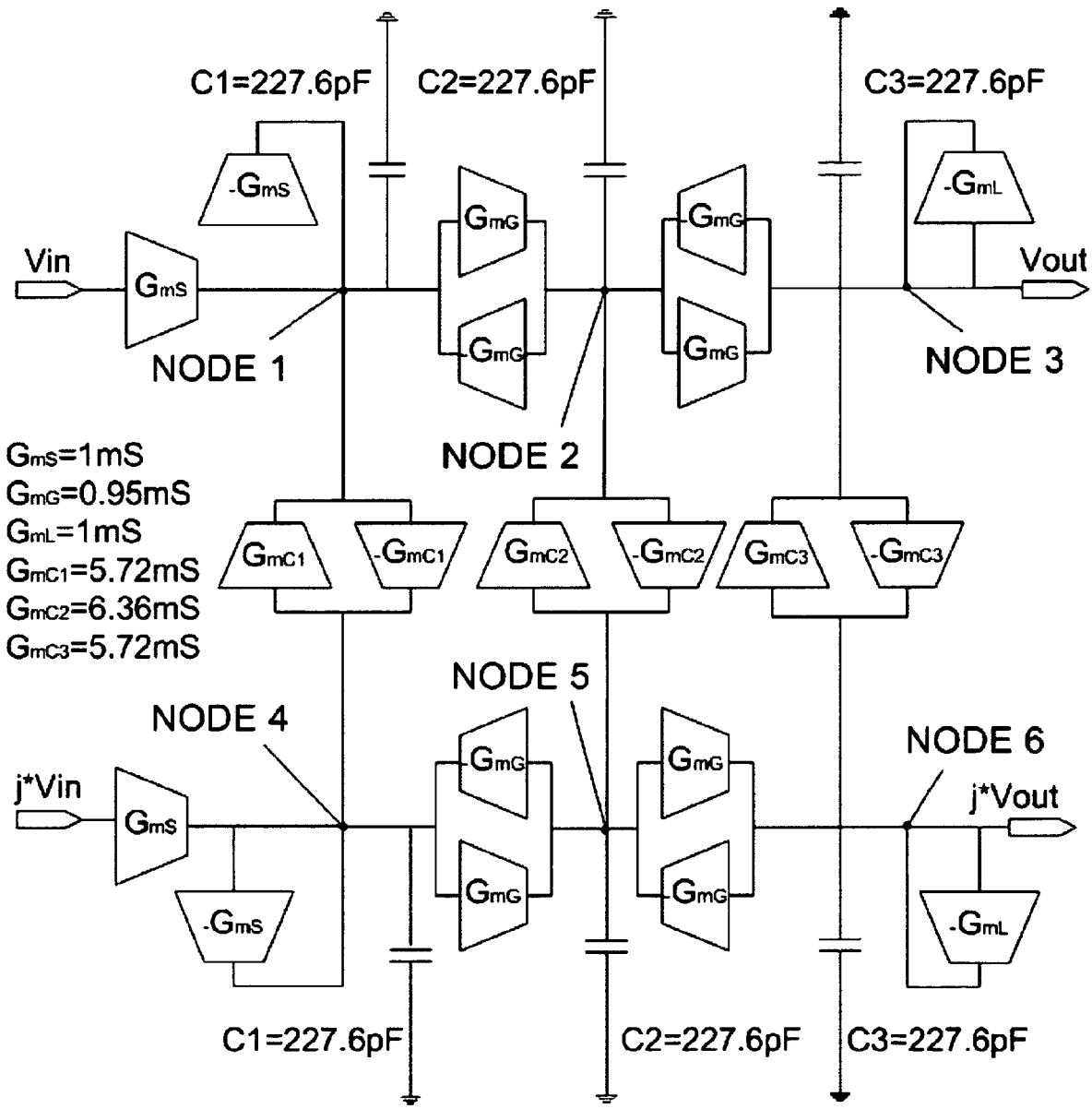
FIG. 6 illustrates an improved network of a complex band pass filter.

The present invention is applicable to a variety of filters including, but not limited to, a complex band pass filter, a band pass filter, etc. For an effective description of the present invention, an example of a synthesis of a $6^{th}$ order complex BPF with bandwidth of 2 MHz and center frequency of 4 MHz is described herein. However, it is ready appreciated by those skilled in the art that the scope of the present invention is not limited to the example illustrated herein, any modification or variation to the present invention are possible without departing from the spirit of the present invention. It is readily appreciated by those skilled in the art that the present invention in applicable in a wireless receiver, such as a blue-tooth receiver, radio frequency receiver, which generally has a mixer and a filter coupled to the mixer. FIG. 6 illustrates an improved network of a complex band pass filter. Compared with the capacitor value in FIG. 3, the capacitors in FIG. 5 are designed for the same capacity of 227.6 pF in this embodiment. Advantageously, with C1, C2, C3 having the same value, capacitors can be adjusted by using only one type of a switch-capacitor-array for filter tuning. The switch-capacitor-array will be further discussed below. This improved complex BPF ensures that the parasitic capacitances introduced by the switch-capacitor-arrays to the filter's nodes (i.e. Node 1, Node 2, Node 3, Node 4, Node 5, Node 6 shown in FIG. 6) are similar. It is apparent that the tuning accuracy will be improved if the parasitic capacitances at the filter's nodes are well-controlled. In order to set C1, C2, C3 to the same value, $G_{mG}$ is changed to 0.95 mS compared with $G_{mG}$=1 mS in FIG. 3. It is ensured that the frequency response of the Complex BPF of FIG. 3 and FIG. 6 are exactly the same even though the values of some of the components are different.

Figure 7:
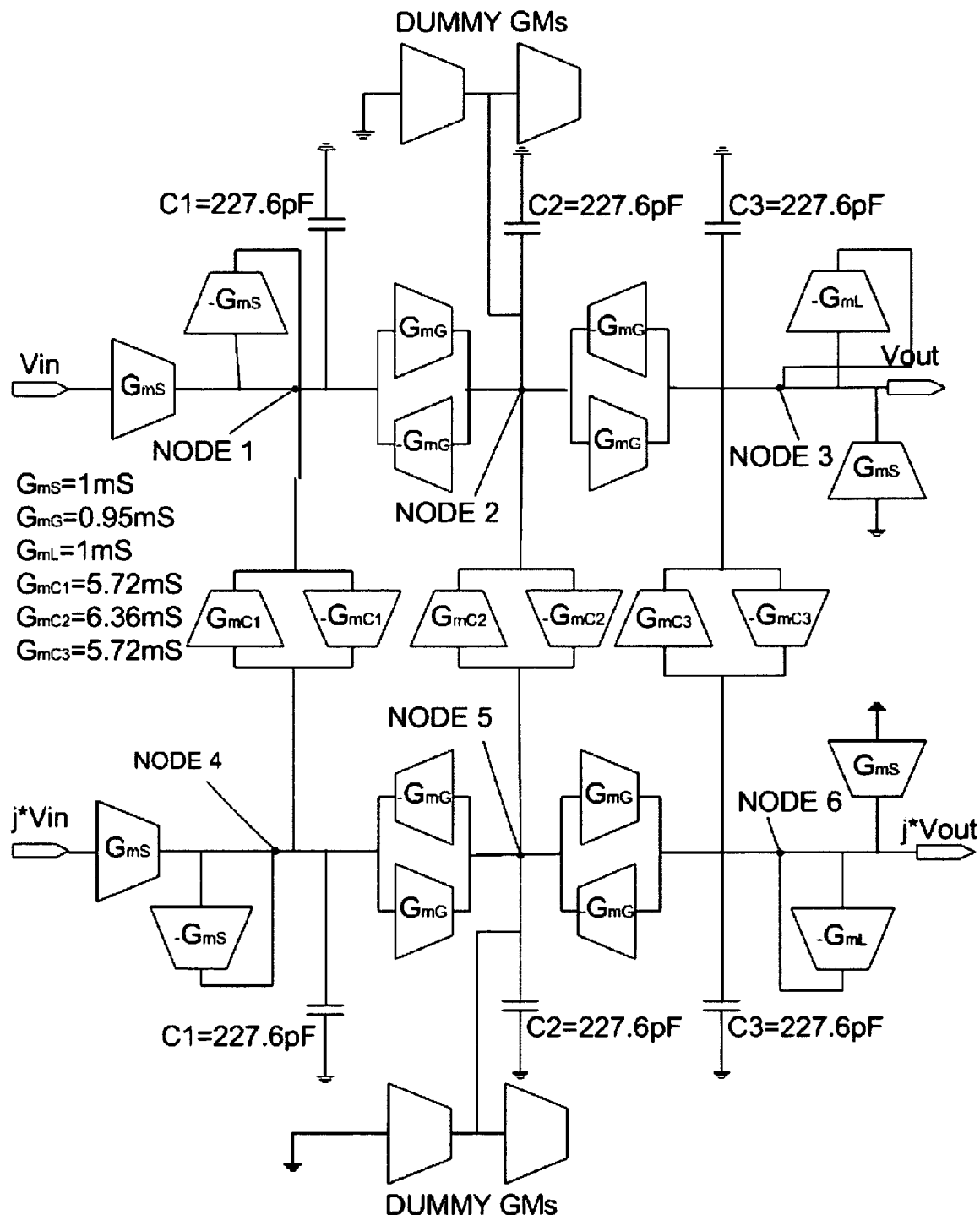
FIG. 7 illustrates yet another improved complex BPF using additional dummy transconductor cells (Gm-cells)

FIG. 7 illustrates yet another improved complex BPF using additional dummy transconductor cells (Gm-cells). Because capacitance seen at Nodes [1 . . . 6] in FIG. 6 are not exactly the same, dummy Gm-cells are thus used to introduce parasitic capacitance to some of the Nodes [1 . . . 6] to ensure that the capacitance seen at Nodes [1 . . . 6] are exactly the same. FIG. 7 illustrates an ideal configuration of adding two dummy GM-cells to Node 2 and Node 5 in order to make the total capacitance (designed capacitance plus the parasitic capacitance) equal from Node 1 to Node 6. Note that the addition of dummy GM-cells is optional depending on the tuning accuracy required.

As described above, the center frequency of a complex BPF is determined by equation (1). Therefore, the center frequency can be tuned to a desired value by either adjusting the transconductance of $G_{mC1}$, $G_{mC2}$, $G_{mC3}$, or adjusting the capacitance of C1, C2, C3. Alternatively, the center frequency can be tuned by adjusting both transconductance and the capacitance.

Figure 8:
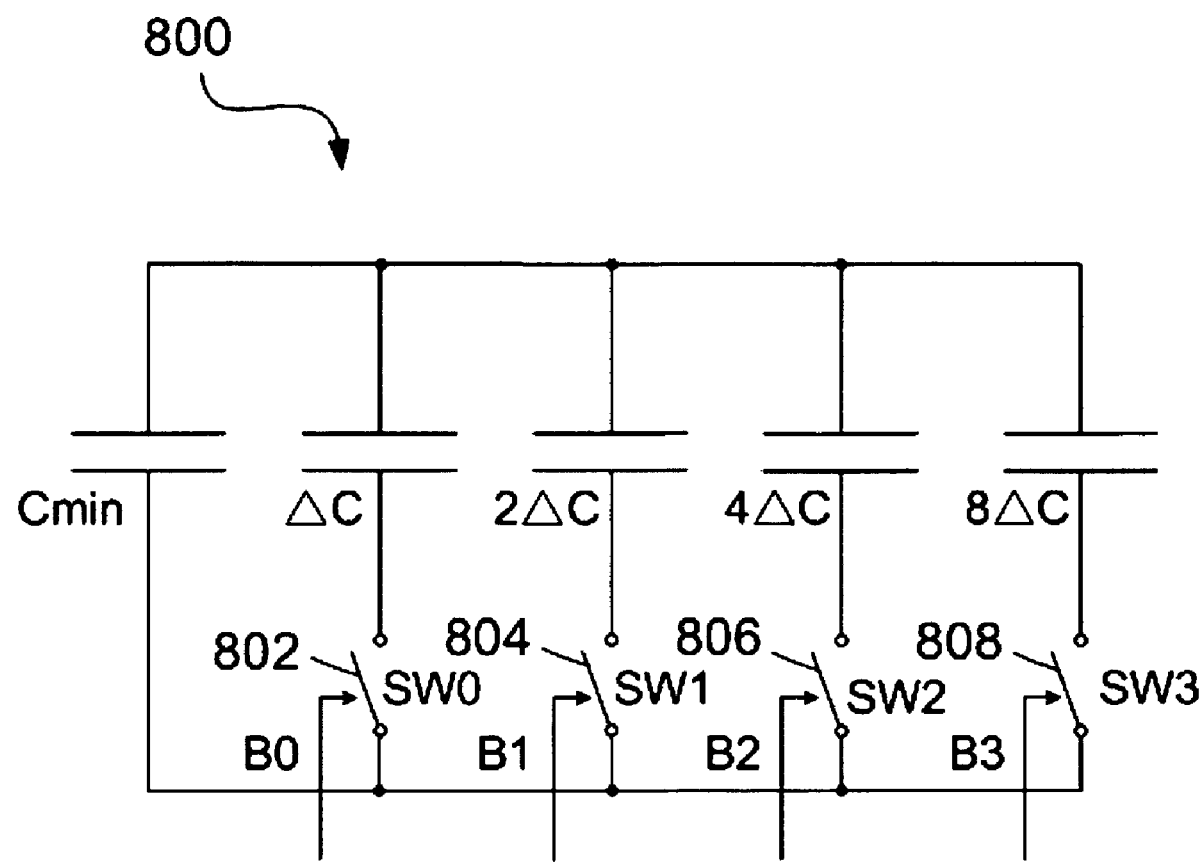
FIG. 8 illustrates a exemplary 4-bit switch-capacitor-array.

FIG. 8 illustrates an exemplary 4-bit switch-capacitor-array 800. Each capacitor C1, C2, and C3 in FIG. 3 and FIG. 6 can be implemented by a switch-capacitor-array 800. By using the switch-capacitor-array, these capacitors can be adjusted progressively to their nominal design values. The switch-capacitor-array 800 includes a plurality of capacitors coupled in parallel. The capacitor Cmin has a predetermined minimum capacitance. SW0 802, SW1 804, SW2 806, SW3 808 are coupled in series with capacitors ΔC, 2 ΔC, 4 ΔC, 8 ΔC, respectively. Four control signals B0, B1, B2, B3 are applied to SW0, SW1, SW2, SW3 to control the conduction states of the four switches. ΔC, 2 ΔC, 4 ΔC, 8 ΔC are selectively chosen in response to the control signals B0, B1, B2, B3 so that a proper capacitance can be obtained to ensure an accurate center frequency of the complex BPF. It should be noted that the number of bits of the control signals depends on the tuning resolution or accuracy required.

Using a switch-capacitor-array to obtain a tunable capacitor is a popular method compared to the tuning of transconductance. In FIG. 3, since the value of C2 is different from that of C1 and C3, it is not easy to tune each capacitor using the same arrangement of switch-capacitor-array. If C1=C2=C3, then, only one kind of switch-capacitor-array is needed. As discussed in FIG. 6, with a proper choice of the value of $G_{mG}$, the values of C1, C2 and C3 can be made equal. For example, if $G_{mG}$=0.948 mS, then C1=C2=C3=227.6 pF.

Figure 9:
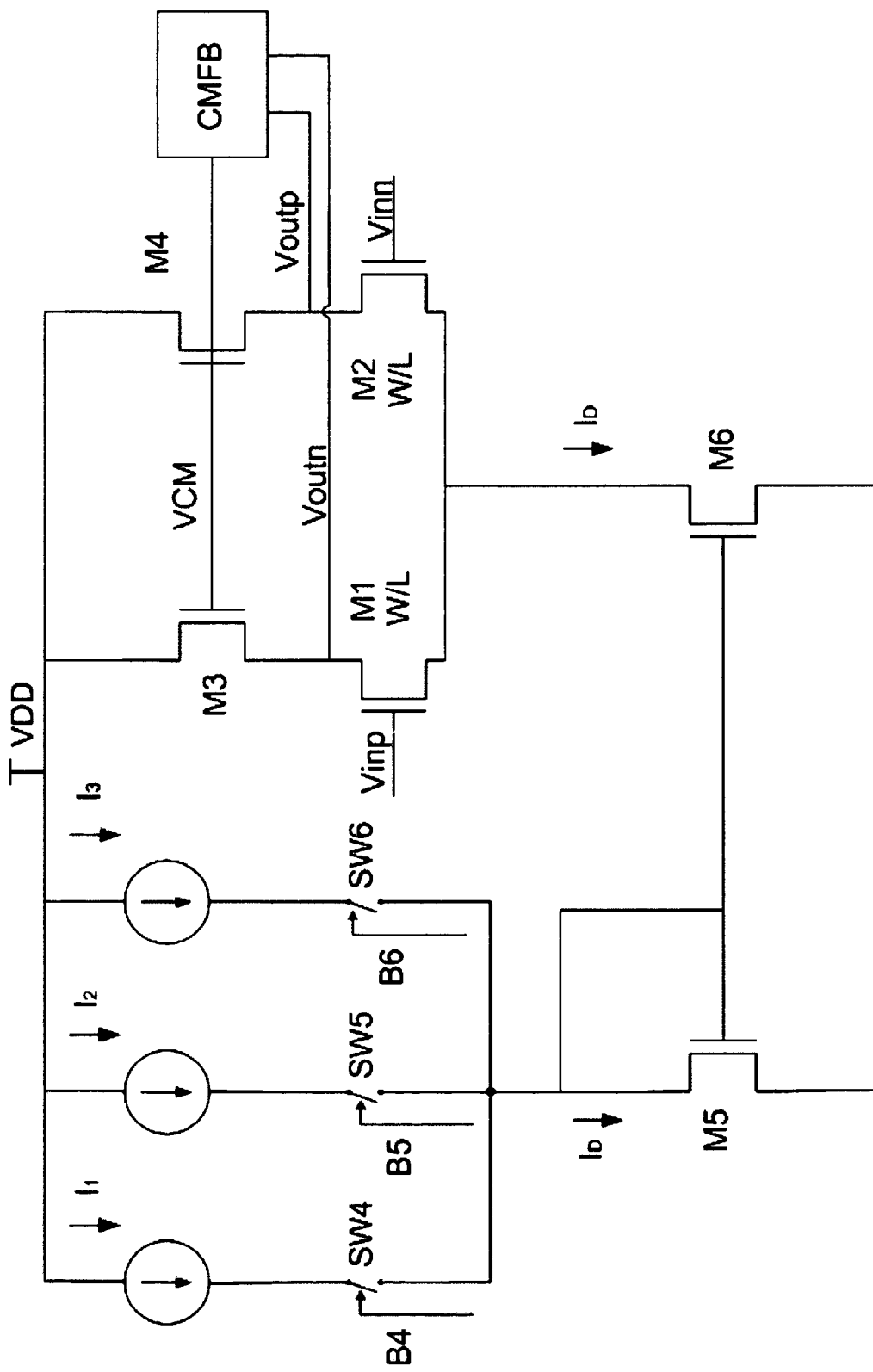
FIG. 9 illustrates a detailed diagram of a differential transconductance cell.

It is also possible to adjust the value of transconductors $G_{mC}$ for the purpose of tuning the center frequency of the complex BPF. FIG. 9 illustrates a detailed diagram of a differential transconductance cell. The value of a transconductor can be tuned by switching the value of its tail current $I_D$ as evident by the following equation (2):

$$Gm = \sqrt{2\mu_n C_{ox} \frac{W}{L} I_D} \qquad (2)$$

Tail current $I_D$ can be tuned digitally by controlling the amount of current flowing into a NMOS current mirror M5. As shown in FIG. 9, current sources I1, I2, I3 provide a sum current representing the tail current $I_D$. Each current source I1, I2, I3 is coupled in series with a switch SW4, SW5, or SW6. 3 bit (B4, B5, B6) control signals are used to control the conduction state of the switches SW4, SW5, and SW6. It is understood by those skilled in the art that the number of current sources and the number of bits for the control signal depend on the tuning resolution or tuning accuracy desired. A common-mode feedback circuit is shown in FIG. 9.

Hence, the filter tuning can be done by tuning digitally either the switch-capacitor-array or GM value. Alternatively, the filter tuning can be done by tuning both GM value and switch-capacitor-array. For example, a control signal with 5-bit [B0 . . . B4] can be divided into two parts. B4 (most significant bit) to B0 (least significant bit) can be used to control the switch-capacitor-array, while one bit (B4) could be used to adjust GM value.

Figure 10A:
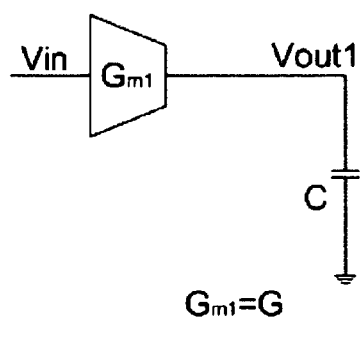
FIG. 10A depicts an ideal integrator.
Figure 10B:
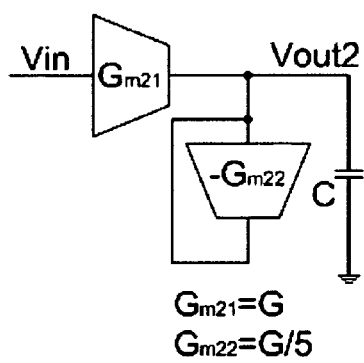
FIG. 10B depicts a lossy integrator.
Figure 10C:
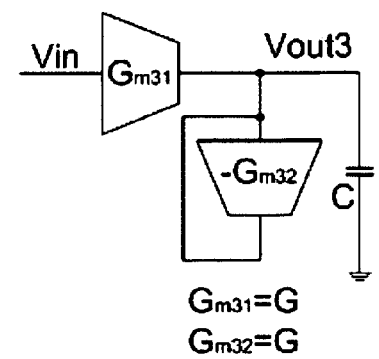
FIG. 10C depicts a low pass filter;.
Figure 11:
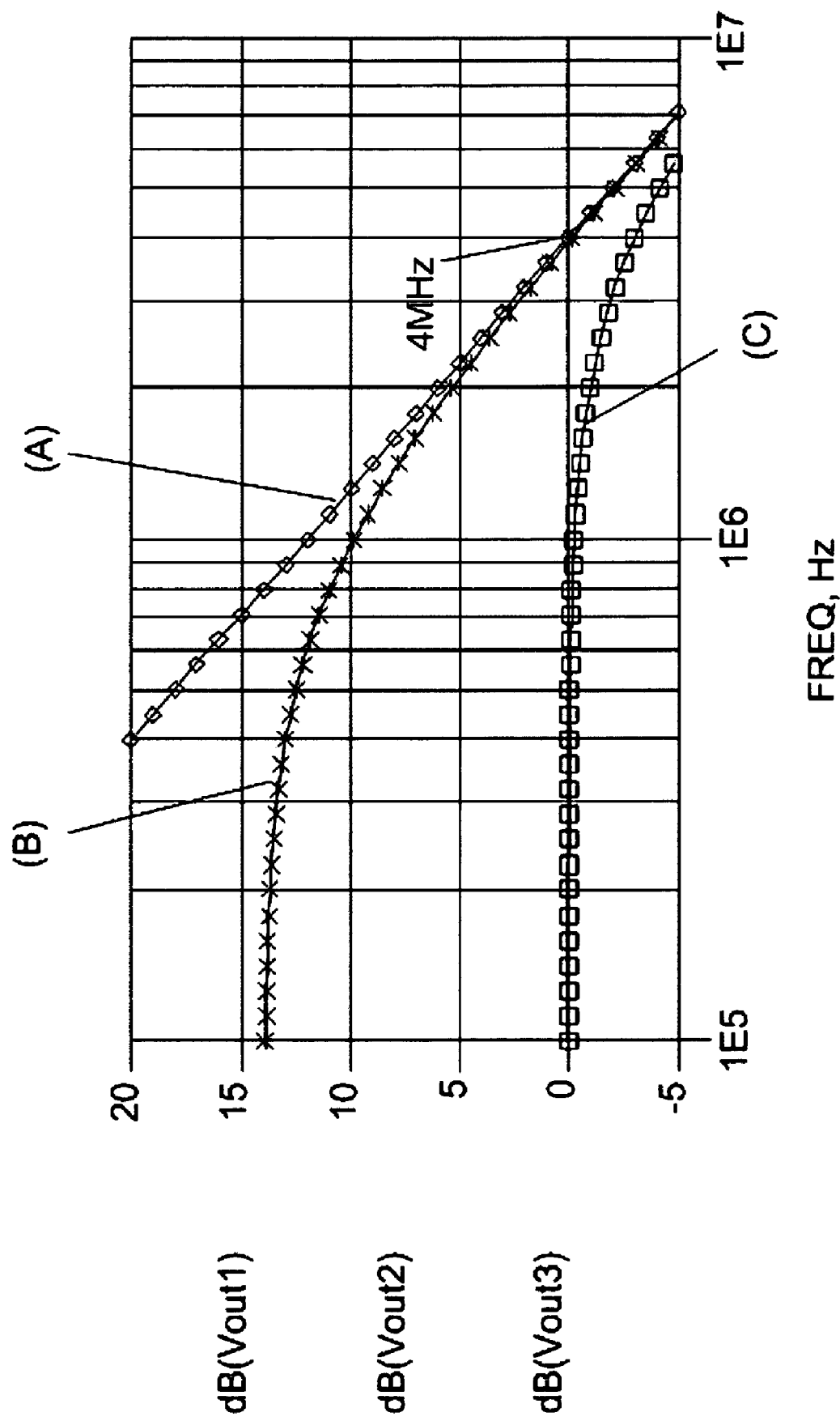
FIG. 11 depicts the frequency responses of FIG. 10A, FIG. 10B, FIG. 10C.

Transconductor cell and capacitor can be arranged into either an integrator or LPF. FIG. 10A depicts an ideal integrator, FIG. 10B depicts a lossy integrator, and FIG. 10C depicts a LPF. The frequency responses of FIG. 10A, FIG. 10B, and FIG. 10C are shown in FIG. 11. In FIG. 10A, 10B, 10C, the values of all the transconductors and capacitors are equal, i.e. Gm=5.72 mS and C=227.6 pF. For the ideal integrator in FIG. 10A, the gain of the integrator is 0 dB at frequency of Gm/(2πC)=4 MHz. For the LPF as shown in FIG. 10C, the gain of the LPF is −3 dB at frequency of Gm/(2πC)=4 MHz. For the lossy integrator, the low frequency gain is reduced with approximately 0 dB gain at frequency of Gm/(2πC)=4 MHz.

The purpose of the present invention is to provide a tuning device whose major components are selected from the filter. In other words, some of the components in the filter shown in FIG. 3, FIG. 6 and FIG. 7 are reused as the components in the tuning device compared with the conventional tuning method using a separate tuning device for filter tuning as discussed in FIG. 5. Advantageously, the chip area and the power consumption can be saved by reusing the components in the complex BPF as the components in the tuning device. More advantageously, the noise introduced to the integrated circuit is greatly reduced compared with the conventional method using a continuous tuning method.

Figure 12:
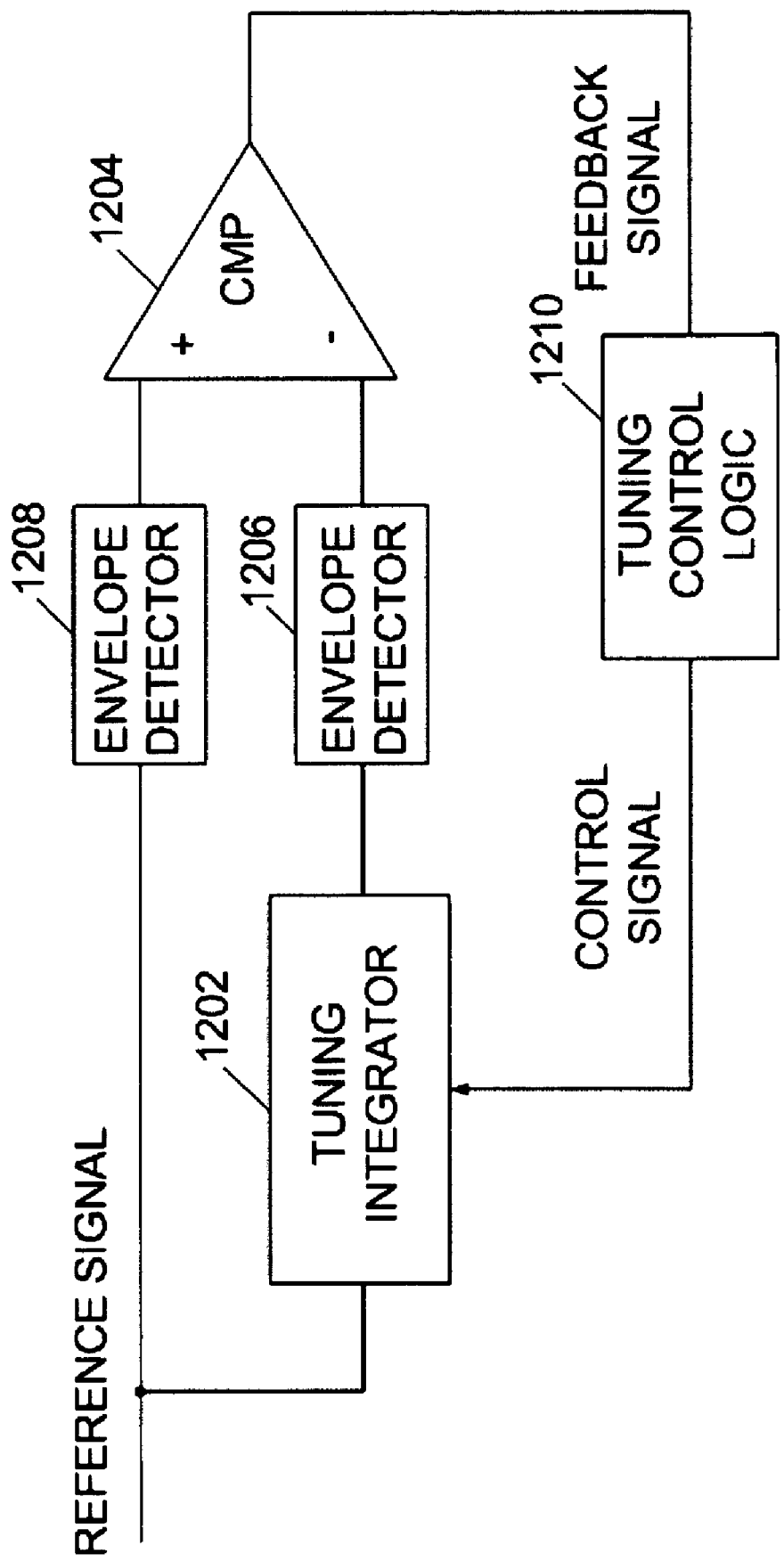
FIG. 12 illustrates a block diagram of a tuning device in accordance with one embodiment of the present invention.

FIG. 12 illustrates architecture of a tuning device in accordance with one embodiment of the present invention. The tuning device includes a tuning integrator 1202, two envelope detectors 1208, 1206, a comparator 1204 and a tuning control logic 1210. Preferably, the tuning integrator 1202 may be a lossy integrator as shown in FIG. 10B. The capacitor and transconductors in the tuning integrator 1202 are selected among the transconductors, C1, C2, C3 from the complex BPF shown in FIG. 3, FIG. 6 or FIG. 7. A major characteristics of the tuning integrator 1202 is that the tuning integrator 1202 has a gain of approximately 0 dB at frequency of $G_{mc}$/C=4 MHz, which is the center frequency of the complex BPF in this example. The tuning integrator receives a reference signal having a frequency associated with a predetermined center frequency (e.g. 4 MHz in this example). The reference signal can be a sinusoidal wave signal in the example. If no component variation occurs to the transconductors or capacitors in the complex BPF, the amplitude of an output signal of the tuning integrator 1202 shall be the same as the amplitude of the reference signal at 4 MHz (frequency of the reference signal). If the amplitude of the output signal of the tuning integrator 1202 is different from the amplitude of the reference signal, it indicates that the values of the transconductors or capacitors in the complex BPF are altered and thus these altered values needs proper adjustment. The two envelope detectors 1206, 1208 are used to detect the peak amplitude of the reference signal and the output signal of the tuning integrator 1202. A comparator 1204 compares the two detected amplitudes and generates a feedback signal indicative of the difference between the amplitude of the reference signal and the amplitude of the output signal of the tuning integrator 1202. The comparator 1204 will decide whether the capacitor value needs to be increased or decreased. If the amplitude of the output signal of tuning integrator 1202 is higher than its input, this means that Gm/(2πC) is too high, thus the capacitor needs to be increased or the transconductor needs to be reduced. The tuning control logic 1210 is used to provide a control signal for adjusting the capacitance or the transconductance of the tuning integrator 1202 depending on the feedback signal. The tuning control logic 1210 continues tuning operation until the amplitude of the output signals of the tuning integrator 1202 equals the amplitude of the reference signal. Once the transconductor and the capacitors in the tuning integrator 1202 are tuned to the nominal design value, all of the transconductors and capacitors in the complex BPF are tuned at the same time accordingly. The control signal can be used to adjust the switch-capacitor-array 800 as the control signal (B0, B1, B2, B3) shown in FIG. 8. Alternatively, the control signal can be used to adjust the value of the transconductors as the control signal (B4, B5, B6) shown in FIG. 9. Alternatively, the control signal can be used to adjust both the switch-capacitor-array and the transcondutance.

As the tuning integrator 1202 has a very high gain at low frequency, any DC offset voltage at its input could be amplified to a very large value at its output. The differential output could swing up to a voltage rail and the transistors could enter into triode region. Therefore, it might be advisable to use a lossy integrator, as shown in FIG. 10B. $G_{m22}$ is enabled during the tuning phase when the lossy integrators are needed. Advantageously, a lower gain of the lossy integrator at low frequency will reduce the undesirable effect of DC offset as mentioned, and yet not affect the tuning accuracy. It should be noted that the tuning integrator 1202 can also be implemented by an arrangement as shown in FIG. 10A. However, the ideal frequency response of FIG. 10A is not easy to achieve in real application. Therefore, the lossy integrator is preferred in this embodiment.

Figure 13:
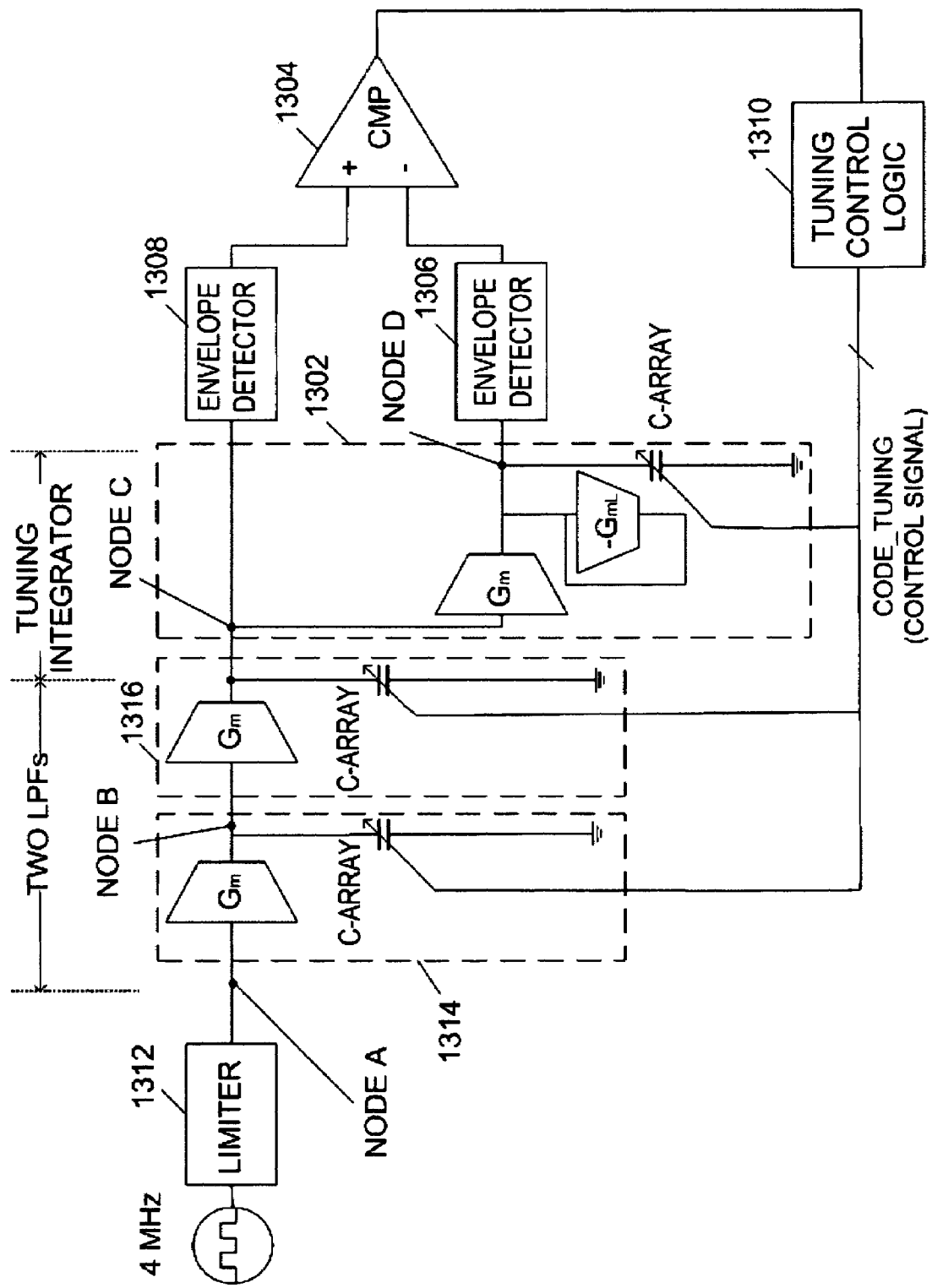
FIG. 13 illustrates a preferred tuning device according to one embodiment of the present invention.

FIG. 13 illustrates a preferred tuning device 1300 according to one embodiment of the present invention. The tuning device 1300 includes a limiter 1312, a first integrator 1314, a second integrator 1316, a tuning integrator 1302, two envelope detectors 1306, 1308, a comparator 1304 and a tuning control logic 1310. The tuning integrator 1302, two envelope detectors 1306, 1308, the comparator 1304, and the tuning control logic 1310 are identical to those described in FIG. 12. Therefore, for simplicity, the descriptions of these elements are omitted herein. The tuning device 1300 receives a square wave signal having a predetermined center frequency (e.g. 4 MHz).

In order to have the tuning integrator 1302 have 0 dB gain at 4 MHz, the tuning integrator must not operate in its non-linear operating region. The input of the tuning integrator has to be a sinusoidal wave with harmonics of small amplitude. Hence, its input signal has to be a sinusoidal signal with small amplitude. The signal cannot be too small that can be affected by circuit noise. This input signal can be obtained from clock signals of the integrated circuits or can be a specially generated signal for filter tuning. However, the clock signals available on the integrated circuit are mostly at the CMOS logic level. Therefore, a limiter 1312 is devised for converting an input square wave signal with CMOS logic level into an output signal of accurate and reasonably small amplitude level.

Figure 14:
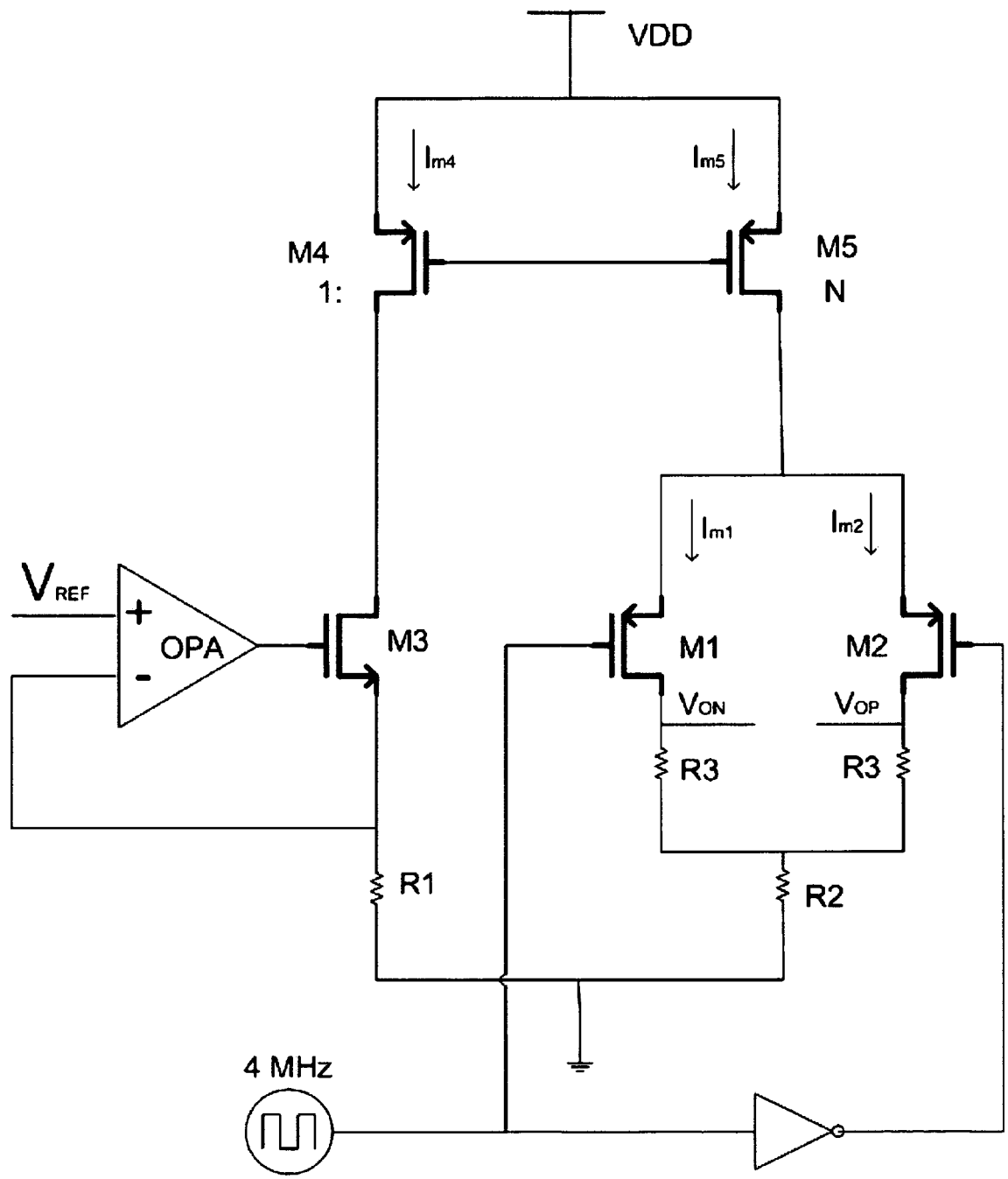
FIG. 14 illustrates a diagram of the limiter used in FIG. 13.

FIG. 14 illustrates a diagram of the limiter 1312 used in FIG. 13. In FIG. 14, $I_{m5}$ is equal to $I_{m4}$. $I_{m4}$ is generated by a voltage-to-current converter formed by operational amplifier (OPA), R1 and M3. $V_{REF}$ is an accurate bandgap reference voltage.

$$I_{M5} = N \times I_{M4} = N \frac{V_{REF}}{R_1}$$

The 4 MHz CMOS logic signal alternatively turns M1 and M2 on and off. Then the voltage level of $V_{OP}$ and $V_{ON}$ will be:

$$V_{OP} = (R_2 + R_3)I_{M5} \text{ or } R_2 I_{M5}$$
$$V_{ON} = R_2 I_{M5} \text{ or } (R_2 + R_3)I_{M5}$$
$$V_{OUT} = V_{OP} - V_{ON} = R_3 I_{M5} = \frac{R_3}{R_1} N \times V_{REF}$$

R2 is used to control the common-mode voltage level of $V_{OP}$ and $V_{ON}$. The differential voltage swing of $V_{OUT}$ can be set by a proper value of R3, R1, N and $V_{REF}$.

Referring back to FIG. 13, the output signal is then fed into two transconductor-capacitor integrators 1314, 1316, which are also referred to as a first LPF 1314 and a second LPF 1316 herein. The two transconductor-capacitor integrators 1314, 1316, act as LPF to convert the clock signal from a square wave signal to a sinusoidal wave signal. These two integrators 1314, 1316, are enough to convert a square wave signal into a sinusoidal wave signal with enough accuracy for the tuning device 1300.

The two LPFs 1314, 1316 can be any type of integrators or LPFs shown in FIG. 10A, FIG. 10B, and FIG. 10C. The transconductors and capacitors in these two LPFs may also be selected from the transconductors and capacitors in the complex BPF. After the sinusoidal wave signal is generated, it is then fed into the tuning integrator 1302. The functionality of the envelope detector 1306, 1308, the comparator 1304, and the tuning control logic 1310 are identical to those in FIG. 12. Therefore, the descriptions of these components are omitted herein.

In the beginning of tuning, the frequency responses of the two LPFs 1314, 1316 are not accurate. However, as the tuning proceeds, the tuning accuracy will be improved.

Figure 15:
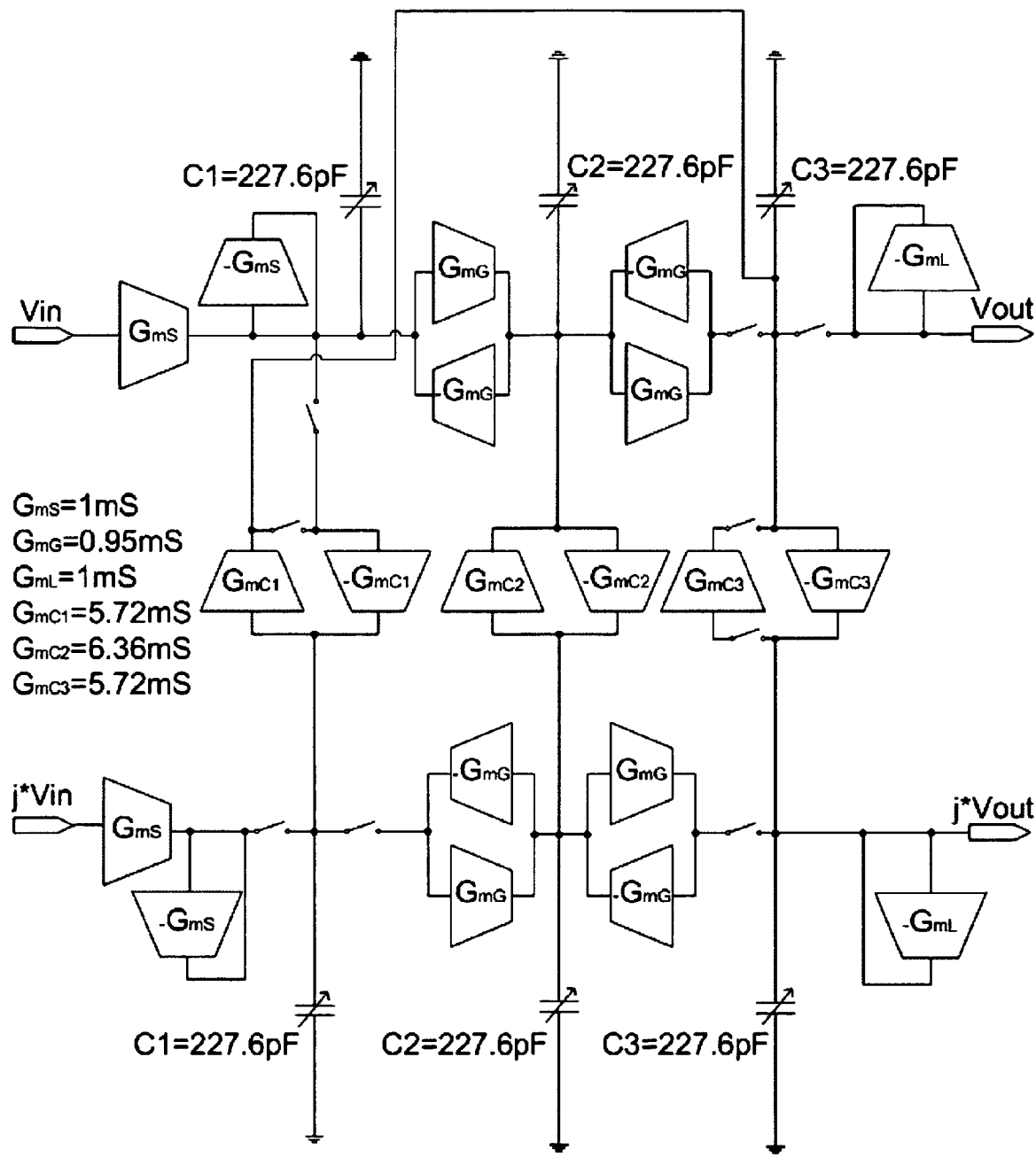
FIG. 15 is an exemplary tunable filter illustrating the switching from the filtering mode to the tuning mode.

The present invention presents two operation modes: a first operation mode and a second operation mode. The first operation mode refers to a filtering phase, while the second operation mode refers to a tuning phase. FIG. 15 is an exemplary tunable filter illustrating the switching from the filtering mode to the tuning mode. Compared with the filter shown in FIG. 3, FIG. 6, and FIG. 7, a plurality of switches are coupled to the complex band pass filter. The plurality of switches are capable of operating in a first state and a second state. When the plurality of switches is in the first state, the complex BPF is configured to operate in the filtering mode, and when the plurality of switches is in the second state, the complex BPF is configured to operate in the tuning mode. It can be seen from FIG. 15 that when the complex BPF is operating in the tuning mode, the complex BPF operates as the tuning device as shown in FIG. 13 by turning off all the switches in FIG. 15. The output of the limiter 1312 is applied to Node A. The first envelope detector 1308 is connected to Node C, while the second envelope detector 1306 is connected to Node D. Thus, by providing a mode control signal to the switches in FIG. 15, a tuning device identical to the tuning device 1300 in FIG. 13 can be built using the existing transconductors and capacitors from the complex BPF.

The reuse of the transconductors and capacitors of the complex BPF during tuning mode will eliminate the need for additional transconductors and capacitors for tuning purpose. The method presented by the present invention improves the tuning accuracy when additional transconductors and capacitors are used in a traditional tuning method. FIG. 15 only shows one possible configuration. According to FIG. 15, three transconductor-capacitor pairs are required in the tuning mode, wherein two of them act as low pass filters and the third one act as a tuning integrator. Variations and modifications can be made to FIG. 15 to obtain the required transconductor-capacitor pairs from the complex BPF. It is also possible to obtain the required transconductor-capacitor pairs from a higher order complex BPF such as an 8th order complex BPF. In one embodiment, the tuning device may have only a single tuning integrator as shown in FIG. 12. Therefore, the configuration of the switches in FIG. 15 may be altered accordingly.

Figure 16:
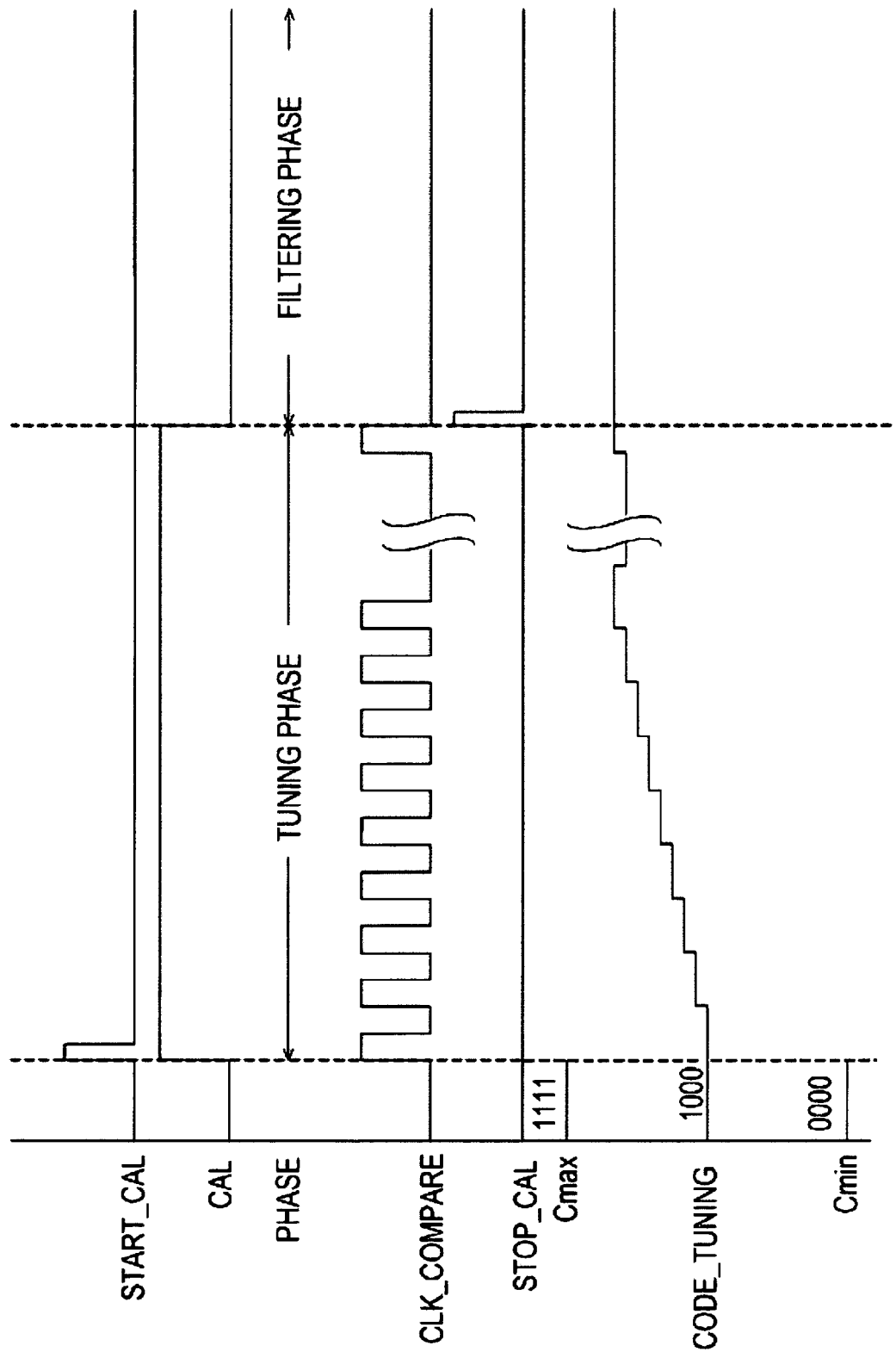
FIG. 16 illustrates a tuning control timing diagram according to one embodiment of the present invention.

FIG. 16 illustrates a tuning control timing diagram according to one embodiment of the present invention. A short pulse START_CAL is used to set CAL=1. CAL signal is a mode selection signal. When CAL=1, the filter is in tuning mode. When CAL=0, the filter is in filtering mode. When the filter is in tuning mode, a tuning device can be built from the existing transconductors and capacitors in the filter via switch configuration. During the tuning mode, a sinusoidal wave signal having a predetermined center frequency at 4MHz is provided. At the beginning of the tuning mode, it could take some time for the two envelope detectors and the comparator to enter into a steady-state. Assuming that 64 cycles of 4 MHz is required for this transition period before the tuning device operates into the steady-state. Thus, CLK_COMPARE with a period of 64/4 MHz should be provided accordingly. At the start of the tuning mode, the CODE_TUNING (also referred to as the control signal mentioned in FIG. 8) could be set to a predefined value. For example, the CODE_TUNING signal can be a 4 bits control signal [B0,B1,B2,B3] having a value of 1000 such that the capacitors are set at a medium value between Cmin ([B0,B1,B2,B3]=0000) and Cmax ([B0,B1,B2,B3]=1111), as shown in FIG. 8. The difference between Cmin and Cmax must be large enough if the filter is to be tuned to a desirable frequency response under an abnormal variation of tranconductance and capacitance. A STOP_CAL pulse signal implies the completion of tuning and it will set CAL=0. With CAL=0, the filter is configured in the filtering mode. Tuning related circuits, such as the comparator and the two envelope detectors that are not needed during the filtering phase, will be shut down.

Figure 17:
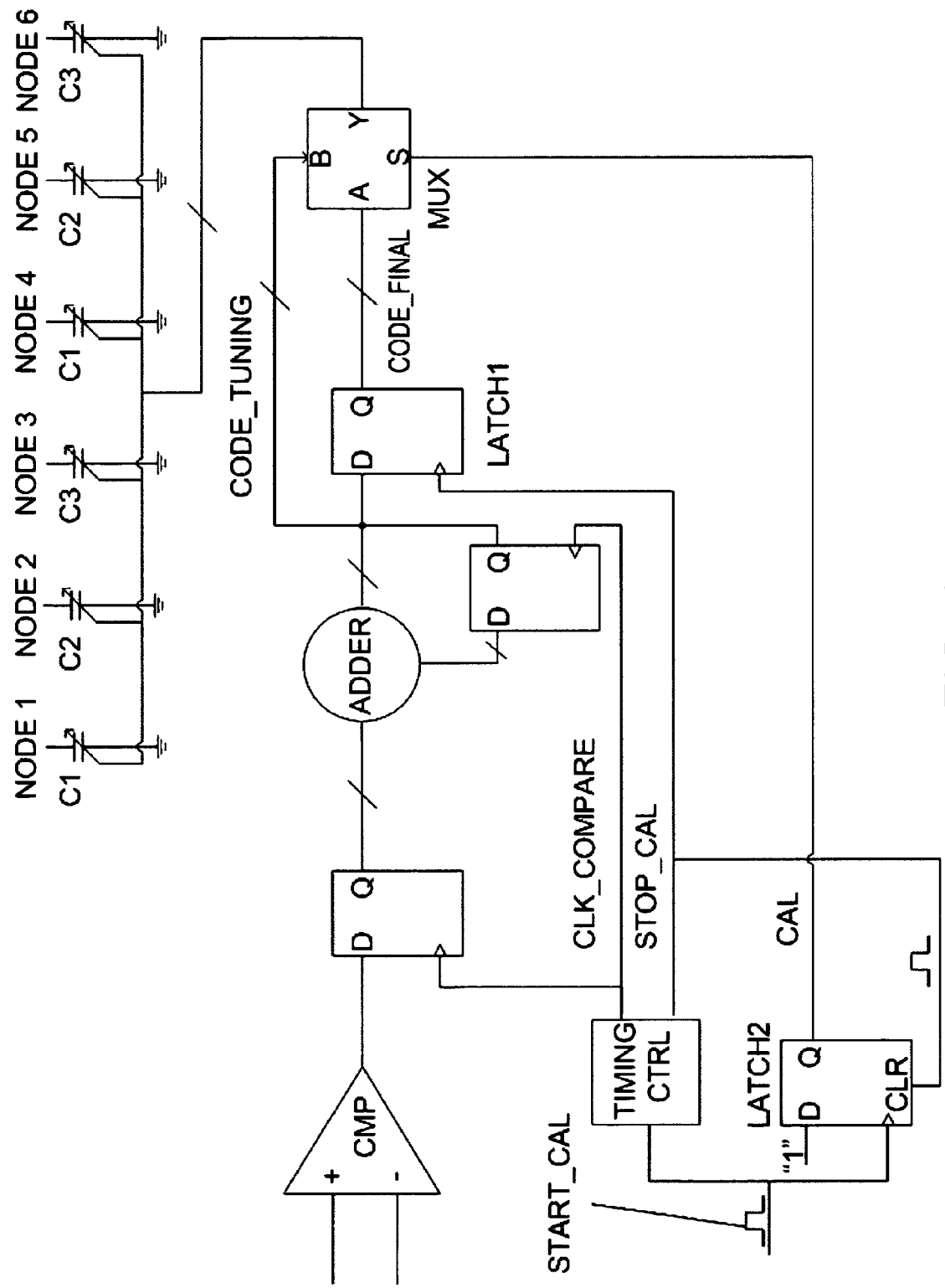
FIG. 17 illustrates a detailed schematic of the tuning control logic 1310 illustrated in FIG. 12 or FIG. 13.

FIG. 17 illustrates a detailed schematic of the tuning control logic 1310 illustrated in FIG. 12 or FIG. 13. The CODE_TUNING (or the control signal) will be increased or decreased depending on the feedback signal provided by the comparator. The switch-capacitor-array is tuned to a new value close to the nominal design value as the CODE_TUNING increased or decreased. At the end of the tuning phase, STOP_CAL signal will latch the final CODE_TUNING and creating CODE_FINAL via LATCH1 in FIG. 17. The STOP_CAL signal will also force CAL signal into zero via LATCH2. CAL=0 will in turn control a multiplexer MUX to select the CODE_FINAL signal. Hence, CODE_FILTER equals CODE_FINAL. With CODE_FINAL signal controlling the switch-capacitor-arrays of filter, the filter is finally tuned to its desired frequency response. As mentioned before, some bits from the CODE_FILTER signal could be used to switch transconductor value with the rest of the CODE_FILTER signal used to control the value of switch-capacitor-array. It is also possible to use all the bits to control the transconductor value or to control the switch-capacitor-arrays alone.

All the switch-capacitor-arrays are controlled by CODE_FILTER. During the tuning phase, CODE_FILTER is equal to CODE_TUNING, while during the filtering phase, CODE_FILTER is equal to CODE_FINAL.

The terms and expressions which have been employed herein are used as terms of description and not of limitation, and there is no intention, in the use of such terms and expressions, of excluding any equivalents of the features shown and described (or portions thereof, and it is recognized that various modifications are possible within the scope of the claims. Other modifications, variations, and alternatives are also possible. Accordingly, the claims are intended to cover all such equivalents.

What is claimed is:

1. A tunable filter, comprising:
a band pass filter having a plurality of transconductors and a plurality of capacitors coupled to said plurality of transconductors, said band pass filter operating at a center frequency;
a plurality of switches coupled to said band pass filter, said plurality of switches capable of operating in a first state and a second state;
a control logic for controlling said plurality of switches;
a comparator coupled to said band pass filter and said control logic; and
a first low pass filter for filtering a reference signal and delivering said filtered reference signal to said band pass filter,
when said plurality of switches are in said first state, said tunable filter is configured as said band pass filter, when said plurality of switches are in said second state, said tunable filter is configured as a tuning device for tuning said center frequency to a predetermined center frequency, said control logic selecting at least one transconductor from said plurality of transconductors and a capacitor from said plurality of capacitors to form a tuning integrator, said at least one transconductor and said capacitor determining said center frequency of said band pass filter, and said control logic selecting a transconductor from said plurality of transconductors and a capacitor from said plurality of capacitors to form said first low pass filter.

2. The tunable filter of claim 1, wherein said tuning integrator generates an output signal at an output terminal based on said reference signal, said reference signal having an amplitude, said output signal having an amplitude, said reference signal being related to said predetermined center frequency of said band pass filter.

3. The tunable filter of claim 2, wherein when said center frequency of said band pass filter is equal to said predetermined center frequency, the amplitude of said output signal of said tuning integrator is equal to the amplitude of said reference signal.

4. The tunable filter of claim 3, wherein said comparator compares the amplitude of said referenced signal with the amplitude of said output signal, and generates a feedback signal, said center frequency of said band pass filter being tuned based on said feedback signal.

5. The tunable filter of claim 3, wherein said tuning integrator further comprises a second transconductor from said plurality of transconductors of said band pass filter selected by said control logic when said plurality of switches are in said second state, said at least one transconductor, said second transconductor, and said capacitor being coupled to said output terminal, said second transconductor having a first terminal and a second terminal coupled to said first terminal.

6. The unable filter of claim 5, wherein a value of said second transconductor is different from a value of said at least one transconductor.

7. The unable filter of claim 4, wherein said control logic is coupled to said band pass filter, and said control logic receives a mode control signal indicative of an operation mode of said tunable filter, wherein when said mode control signal is indicative of a filtering mode, said control logic sets said plurality of switches in said first state, when said mode control signal is indicative of a tuning mode, said control logic sets said plurality of switches in said second state.

8. The tunable filter of claim 7, wherein said plurality of capacitors are tunable, said control logic being capable of tuning said center frequency to said predetermined center frequency by adjusting said plurality of capacitors according to said feedback signal.

9. The tunable filter of claim 7, wherein said plurality of transconductors are tunable, said control logic being capable of tuning said center frequency to said predetermined center frequency by adjusting said plurality of transconductors according to said feedback signal.

10. The tunable filter of claim 7, wherein said plurality of transconductors and said plurality of capacitors are tunable, said control logic being capable of tuning said center frequency to said predetermined center frequency by adjusting said plurality of transconductors and said plurality of capacitors according to said feedback signal.

11. The tunable filter of claim 4, wherein said tuning device further comprising:
said first low pass filter; and
a second low pass filter coupled in series with said first low pass filter and said tuning integrator, said control logic selecting a transconductor from said plurality of transconductors and a capacitor from said plurality of capacitors to form said second low pass filter, said second low pass filter being capable of further filtering said filtered reference signal, generating a sinusoidal signal and delivering said sinusoidal signal to said tuning integrator.

12. The tunable filter of claim 1, wherein said band pass filter is a complex band pass filter.

13. A wireless receiver for receiving a wireless signal, comprising:
a mixer for shifting said wireless signal to a lower frequency signal; and
a tunable filter coupled to said mixer for adjusting said lower frequency signal to a predetermined center frequency signal, said tunable filter comprising:
a band pass filter having a plurality of transconductors and a plurality of capacitors coupled to said plurality of transconductors, said band pass filter operating at a center frequency;
a plurality of switches coupled to said band pass filter, said plurality of switches capable of operating in a first state and a second state; and
a control logic for controlling said plurality of switches;
a comparator coupled to said band pass filter and said control logic; and
a first low pass filter for filtering a reference signal and delivering said filtered reference signal to said band pass filter,
when said plurality of switches are in said first state, said tunable filter is configured as said band pass filter, when said plurality of switches are in said second state, said tunable filter is configured as a tuning device for tuning said center frequency to said predetermined center frequency, said control logic selecting at least one transconductor from said plurality of transconductors and a capacitor from said plurality of capacitors to form a tuning integrator, said at least one transconductor and said capacitor determining said center frequency of said band pass filter, and said control logic selecting a transconductor from said plurality of transconductors and a capacitor from said plurality of capacitors to form said fast low pass filter.

14. The wireless receiver of claim 13, wherein said tuning integrator generates an output signal at an output terminal based on said reference signal, said reference signal having an amplitude, said output signal having an amplitude, said reference signal being related to said predetermined center frequency of said band pass filter.

15. The wireless receiver of claim 14, wherein when said center frequency of said band pass filter is equal to said predetermined center frequency, the amplitude of said output signal of said tuning integrator is equal to the amplitude of said reference signal.

16. The wireless receiver of claim 15, wherein said comparator compares the amplitude of said reference signal with the amplitude of said output signal, and generates a feedback signal, said center frequency of said band pass filter being tuned based on said feedback signal.

17. The wireless receiver of claim 15, wherein said tuning integrator farther comprises a second transconductor from said plurality of transconductors of said band pass filter selected by said control logic when said plurality of switches are in said second state, said at least one transconductor, said second transconductor, and said capacitor being coupled to said output terminal, said second transconductor having a first terminal and a second terminal coupled to said first terminal.

18. The wireless receiver of claim 17, wherein a value of said second transconductor is different from a value of said at least one transconductor.

19. The wireless receiver of claim 16, wherein said tunable filter further comprising a control logic coupled to said band pass filter, said control logic receiving a mode control signal indicative of an operation mode of said tunable filter, wherein when said mode control signal is indicative of a filtering mode, said control logic sets said plurality of switches in said first state, when said mode control signal is indicative of a tuning mode, said control logic sets said plurality of switches in said second state.

20. The wireless receiver of claim 17, wherein said plurality of capacitors are tunable, said control logic being capable of tuning said center frequency to said predetermined center frequency by adjusting said plurality of capacitors according to said feedback signal.

21. The wireless receiver of claim 17, wherein said plurality of transconductors are tunable, said control logic being capable of tuning said center frequency to said predetermined center frequency by adjusting said plurality of transconductors according to said feedback signal.

22. The wireless receiver of claim 17, wherein said plurality of transconductors and said plurality of capacitors are tunable, said control logic being capable of tuning said center frequency to said predetermined center frequency by adjusting said plurality of transconductors and said plurality of capacitors according to said feedback signal.

23. The wireless receiver of claim 16, wherein said tuning device further comprising:
said first low pass filter; and
a second low pass filter coupled in series with said first low pass filter and said tuning integrator, said control logic selecting a transconductor from said plurality of transconductors and a capacitor from said plurality of capacitors to form said second low pass filter, said second low pass filter being capable of further filtering said filtered reference signal, generating a sinusoidal signal and delivering said sinusoidal signal to said timing integrator.

24. The wireless receiver of claim 13, wherein said band pass filter is a complex band pass filter.

25. A method for providing a tunable band pass filter, said band pass filter having a plurality of transconductors and a plurality of capacitors, comprising:

filtering a reference signal by a low pass filter;

delivering said filtered reference signal to said tunable band pass filter;

providing a mode selection signal to said tunable band pass filter by a control logic;

configuring said tunable band pass filter to operate as a band pass filter when said mode selection signal represents a filtering mode;

configuring said tunable band pass filter to operate as a tuning device for tuning a center frequency of said Unable band pass filter when said mode selection signal represents a tuning mode;

selecting a transconductor from said plurality of transconductors and a capacitor from said plurality of capacitors to build said low pass filter under control of said control logic when said tunable band pass filter is in said tuning mode; and selecting at least one transconductor from said plurality of transconductors and a capacitor from said plurality of capacitors to build said tunable band pass filter under control of said control logic when said tunable band pass filter is in said tuning mode.

26. The method of claim 25, wherein said at least one transconductor and said capacitor determines said center frequency of said tunable band pass filter.

27. The method of claim 26, further comprising:

providing a reference signal representative of a predetermined center frequency to said tuning integrator;

generating an output signal at said tuning integrator; and providing an output-input relationship of said tuning integrator that has a certain gain when said center frequency equals said predetermined center frequency, an amplitude of said output signal equals an amplitude of a reference signal.

28. The method of claim 27, further comprising:

comparing said output signal of said tuning integrator to said reference signal; and providing a feedback signal indicative of The difference between said reference signal and said output signal to said tunable band pass filter.

29. The method of claim 28, further comprising:

tuning said center frequency to said predetermined center frequency by adjusting said plurality of capacitors according to said feedback signal.

30. The method of claim 28, further comprising:

tuning said center frequency to said predetermined center frequency by adjusting said plurality of transconductors according to said feedback signal.

31. The method of claim 28, further comprising:

tuning said center frequency to said predetermined center frequency by adjusting said plurality of transconductors and said plurality of capacitors according to said feedback signal.

* * * * *